United States Patent [19]
Miyashita et al.

[11] Patent Number: 5,698,878
[45] Date of Patent: Dec. 16, 1997

[54] PLATE POTENTIAL APPLYING STRUCTURE OF TRENCH CAPACITOR CELL

[75] Inventors: Atsuko Miyashita, Sagamihara; Yusuke Kohyama, Yokosuka, both of Japan

[73] Assignee: Kabushiki Kaisha Toshiba, Kawasaki, Japan

[21] Appl. No.: 620,086

[22] Filed: Mar. 21, 1996

[30] Foreign Application Priority Data

Mar. 31, 1995 [JP] Japan .................................. 7-076758

[51] Int. Cl.⁶ .................. H01L 27/108; H01L 29/76; H01L 29/94; H01L 31/119

[52] U.S. Cl. .................. 257/301; 257/296; 257/304; 257/534; 257/622; 257/906; 257/908; 365/189.05; 365/230.01

[58] Field of Search .......................... 257/296, 301, 257/304, 534, 622, 906, 908; 365/189.05, 230.01

[56] References Cited

U.S. PATENT DOCUMENTS

| | | | |
|---|---|---|---|
| 4,918,502 | 4/1990 | Kaga et al. | 357/23.6 |
| 5,293,347 | 3/1994 | Ogawa | 365/230.01 |
| 5,377,151 | 12/1994 | Komuro | 365/208 |
| 5,432,365 | 7/1995 | Chin et al. | 257/301 |

OTHER PUBLICATIONS

IEEE Transactions on Electron Devices, vol. 35, No. 8, pp. 1257–1263, Half–$V_{cc}$ Sheath–Plate Capacitor DRAM Cell With Self–Aligned Buried Plate Wiring, T. Kaga et al, Aug. 1988.

International Electron Devices Meeting 1993, pp.627–630, A 0.6 μm² 256Mb Trench DRAM Cell With Self–Aligned BuriEd STrap (BEST), L. Nesbit et al., Dec. 5–8, 1993.

Primary Examiner—Wael Fahmy
Assistant Examiner—Howard Weiss
Attorney, Agent, or Firm—Banner & Witcoff, Ltd.

[57] ABSTRACT

A DRAM cell includes first and second trenches formed in a P-type silicon substrate, a first N-type diffusion layer formed around the first trench, and a second N-type diffusion layer formed around the second trench, contacting the first N-type diffusion layer, and reaching the surface of the substrate. In the first trench, a storage node electrode whose capacitance is coupled to the first N-type diffusion layer and a conductive polysilicon film for leading the storage node electrode to the surface of the substrate are provided. One of source and drain regions of each cell transistor is connected to the conductive polysilicon film. The first N-type diffusion layer is connected to the second N-type diffusion layer, and the second diffusion layer is connected to a plate potential supply-line.

11 Claims, 13 Drawing Sheets

PLATE POTENTIAL APPLYING STRUCTURE OF TRENCH CAPACITOR CELL

BACKGROUND OF THE INVENTION

1. Field of the Invention

The present invention relates to a semiconductor device and, more specifically, to a semiconductor device having a plate wiring layer buried in an internal region of a semiconductor substrate.

2. Description of the Related Art

A dynamic RAM (referred to as DRAM hereinafter) integrating Buried Plate Trench capacitor cells (referred to as BPT cells) is currently employed as a semiconductor device including a buried wiring layer formed in an internal region of a semiconductor substrate.

The BPT cell is disclosed in detail in T. Kaga et al., "Half-Vcc Sheath-Plate Capacitor DRAM Cell with Self-Aligned Buried Plate Wiring," IEEE Transactions on Electron Devices, Vol. 35, No. 8, August 1988, pp. 1257–1263 (hereinafter referred to as reference 1), Jpn. Pat. Appln. KOKAI Publication No. 63-136558, and the like.

The BPT cell will now be described briefly. In the BPT cell, plate electrodes are formed inside their respective trenches formed in a P-type substrate. These plate electrodes are connected to each other by an N-type diffusion layer contacting the bottoms of the trenches. The N-type diffusion layer serves as a buried-wiring layer, and a plate potential VPL is applied to each of the plate electrodes through the N-type diffusion layer.

The buried-wiring layer has to be pulled up to the surface of the substrate in order to apply the plate potential VPL to the buried-wiring layer. An idea of doing so is disclosed in reference 1, Jpn. Pat. Appln. KOKAI Publication No. 63-136559, and Jpn. Pat. Appln. KOKAI Publication No. 6-29485.

According to reference 1 and Publication No. 63-136559, since a trench is structurally devised and an N-type diffusion layer is formed along the trench, a buried-wiring layer can be pulled up to the surface of the substrate using the N-type diffusion layer. However, the N-type diffusion layer is formed on the substrate excluding the trench, so that it is hard to improve in density of integration.

The method of manufacturing a DRAM includes a step which is not common to that of forming a BPT cell, such as a step of removing a silicon oxide film ($SiO_2$) from the side wall of the trench, thus making it difficult to manufacture the DRAM and improve in yield. The deterioration in yield is a serious problem to a DRAM having a large capacity of 64 Mb or 256 Mb and a great number of integrated devices.

In contrast, Publication No. 6-29485 teaches leading a buried-wiring layer to the surface of the substrate using a well. In this reference, a trench need not be structurally devised and thus the DRAM is easy to manufacture. For this reason, the yield is easier to improve than that in reference 1 and Publication No. 63-136559, but the density of integration is much lower because of the use of the well.

In the BPT cell described above, a plate potential VPL is often set to a so-called half VCC which corresponds to half of a power supply voltage VCC. The potential of the well is therefore set to the half VCC, and none of the other electrical elements such as MOSFET are not arranged in the well. Consequently, the well, which serves only as a region through which the plate potential VPL is applied to the N-type diffusion layer, is a dead region which does not contribute to improvement in density of integration.

SUMMARY OF THE INVENTION

The present invention has been developed in consideration of the above situation and its object is to provide a semiconductor device having a connecting element capable of applying a potential to a buried-wiring layer in a small area, and a method of manufacturing the same.

To attain the above object, there is provided a semiconductor device comprising: a semiconductor region of a second conductivity type buried into a semiconductor substrate of a first conductivity type; a first trench formed in the semiconductor substrate so as to reach the semiconductor region and filled with an electrode whose capacitance is coupled to the semiconductor region; and a second trench filled with a material having the same structure as that of the first trench, a wiring layer of the second conductivity type for leading the semiconductor region to the surface of the semiconductor substrate being formed around the second trench.

Since the above semiconductor device includes the wiring layer of the second conductivity type for leading the semiconductor region to the surface of the surface of the substrate, if a potential is applied to the wiring layer, the potential can be applied to the semiconductor region in a smaller area than in the case of a semiconductor device including a well for leading a buried wiring layer.

In the above semiconductor device, the first trench is filled with an electrode whose capacitance is coupled to the semiconductor region, and the second trench is filled with the same electrode as that of the first trench. Therefore, the second trench can be decreased in diameter as compared with a device including a plate electrode and a storage node electrode formed in a trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings. The same structural elements shown in all the drawings are denoted by the same reference numerals and their descriptions are not repeated.

Figure 1A:
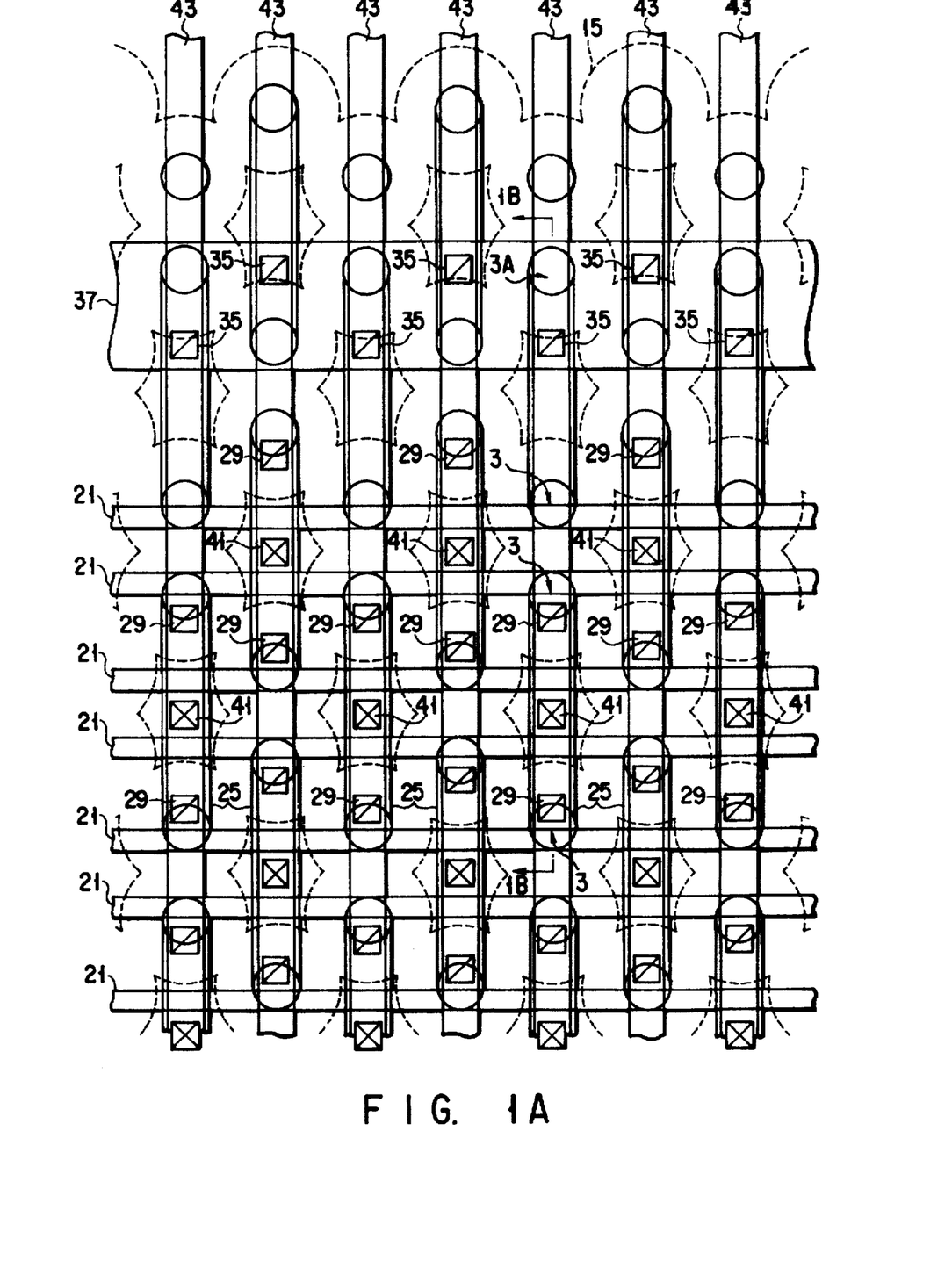
FIG. 1A is a pattern plan view of a DRAM according to a first embodiment of the present invention.
Figure 1B:
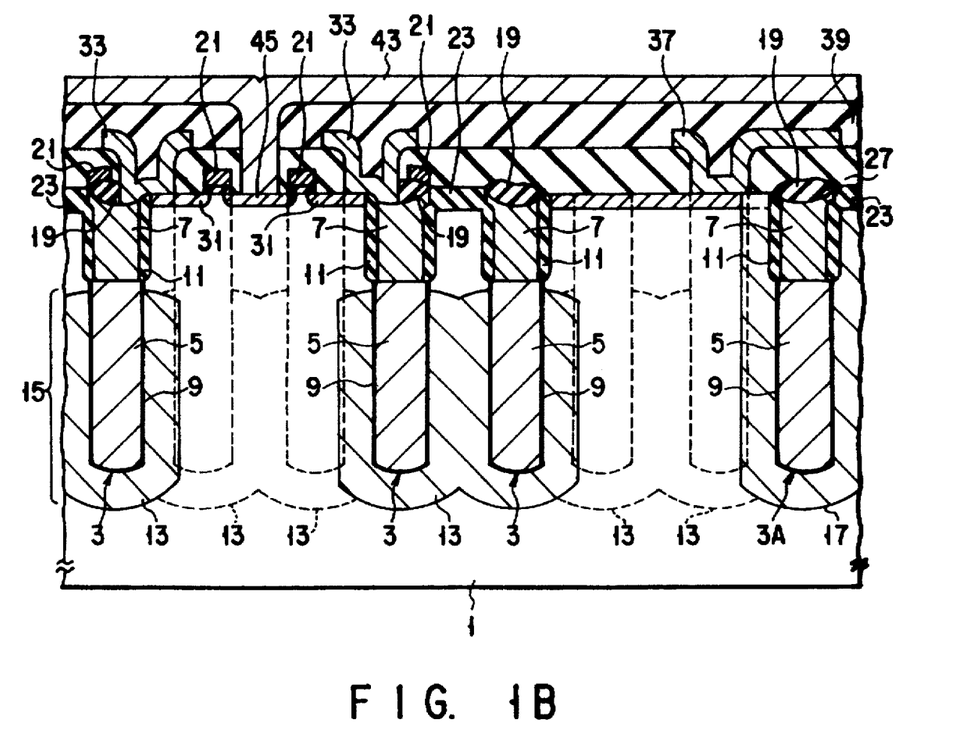
FIG. 1B is a cross-sectional view taken along the line 1B—1B of FIG. 1A.

FIG. 1A is a plan view of a memory cell array of a DRAM according to a first embodiment of the present invention, and FIG. 1B is a cross-sectional view taken along line 1B—1B of FIG. 1A.

As illustrated in FIGS. 1A and 1B, a plurality of trenches 3 and 3A are formed in a P-type silicon substrate 1. While the trenches 3 are used for forming storage node electrodes of memory cells, the trench 3A is done for forming a lead-out wiring layer. The trench 3A is formed on the edge of the memory cell array.

A conductive polysilicon (normally N-type dope) film 5 is formed in each of the trenches 3 and 3A to partially fill the trench. A conductive polysilicon film (normally N-type dope) 7 is also formed in each of the trenches in contact with the conductive polysilicon film 5 to fill the trench. A capacitor dielectric film 9 is formed on the side wall of each of the trenches along the conductive polysilicon film 5. A silicon oxide film ($SiO_2$) 11, which is thicker than the capacitor dielectric film 9, is formed on the wide wall of each of the trenches along the conductive polysilicon film 7.

In substrate 1 contacting the trenches, N-type diffusion layers 13 are formed along the capacitor dielectric films 9. The N-type diffusion layers 13 extend to the halfway portions of the trenches 3 and are buried into the substrate 1. The N-type diffusion layers 13 are electrically connected to each other thereby to constitute a buried-wiring layer 15. The layer 15 serves as a plate electrode of each memory cell.

An N-type diffusion layer 17, which contacts the N-type diffusion layer 13 and reaches the surface of the substrate 1, is formed in the substrate 1 contacting the trench 3A. The layer 17 functions as a lead-out wiring layer for leading out the buried-wiring layer 15 to the surface of the substrate 1.

A silicon oxide film ($SiO_2$) 19 is formed on the surface of the polysilicon layer 7. The film 19 insulates the polysilicon layer 7 from a word-line 21.

A field oxide film ($SiO_2$) 23 is formed in a surface region of the substrate 1 by LOCOS. As shown in FIG. 1A, the film 23 defines a plurality of rectangular element forming regions 25 from which silicon is exposed. In the DRAM of the first embodiment, the element forming regions 25 are so arranged that when the length of each region 25 in a column direction of two memory cells is one pitch, the regions 25 are displaced from each other by ½ pitch.

A silicon oxide film ($SiO_2$) 27 is formed on the surface of the substrate 1 in which the trenches 3 and 3A, field oxide film 23, etc. are formed. The film 27 is provided with a plurality of contact holes 29 corresponding to the trenches 3. The contact holes 29 are each formed over both the polysilicon layer 7 and N-type source diffusion layer 31 formed in the substrate 1. A wiring layer 33 for connecting one source diffusion layer 31 and one storage node electrode 5 via the polysilicon layer 7, is formed in each of the contact holes 29. The wiring layer 33 is conductive polysilicon (normally N-type dope).

The oxide film 27 is provided with a contact hole 35 adjacent to the lead-out trench 3A. At least the surface of the N-type diffusion layer 17 is exposed from the silicon oxide film 27 through the contact hole 35, with the result that the buried-wiring layer 15 is pulled up to the surface of the substrate 1. A plate potential feeding-line 37 is formed on the oxide film 27. Since the feeding-line 37 is electrically connected to the N-type diffusion layer 17 through the contact hole 35, a plate potential VPL is applied to the buried-wiring layer 15 through the lead-out wiring layer formed along the side wall of the trench 3A. The feeding-line 37 is, for example, conductive polysilicon (normally N-type dope) whose conductivity type is the same as that of the wiring layer 33.

A silicon oxide film ($SiO_2$) 39 is formed on the oxide film 27, and a predetermined number of bit-lines 43 are formed on the oxide film 39. The bit-lines 43 are electrically connected to an N-type drain diffusion layer 45 of a memory cell transistor through a contact hole provided in the oxide film 39.

A method of manufacturing a DRAM according to the first embodiment will now be described.

Figure 2A:
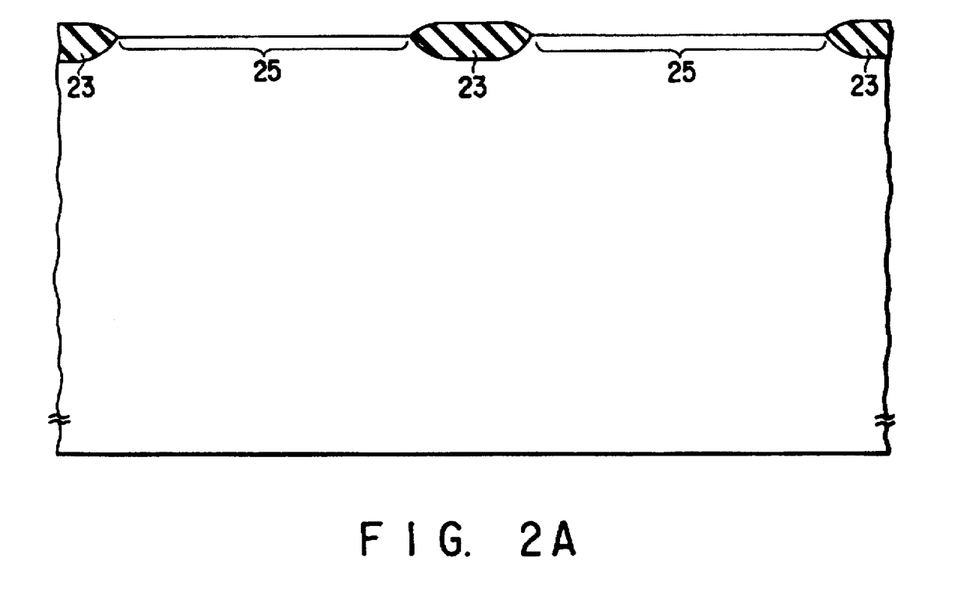
FIGS. 2A to 2P are cross-sectional views showing the major steps of manufacturing the DRAM according to the first embodiment of the present invention.
Figure 2B:
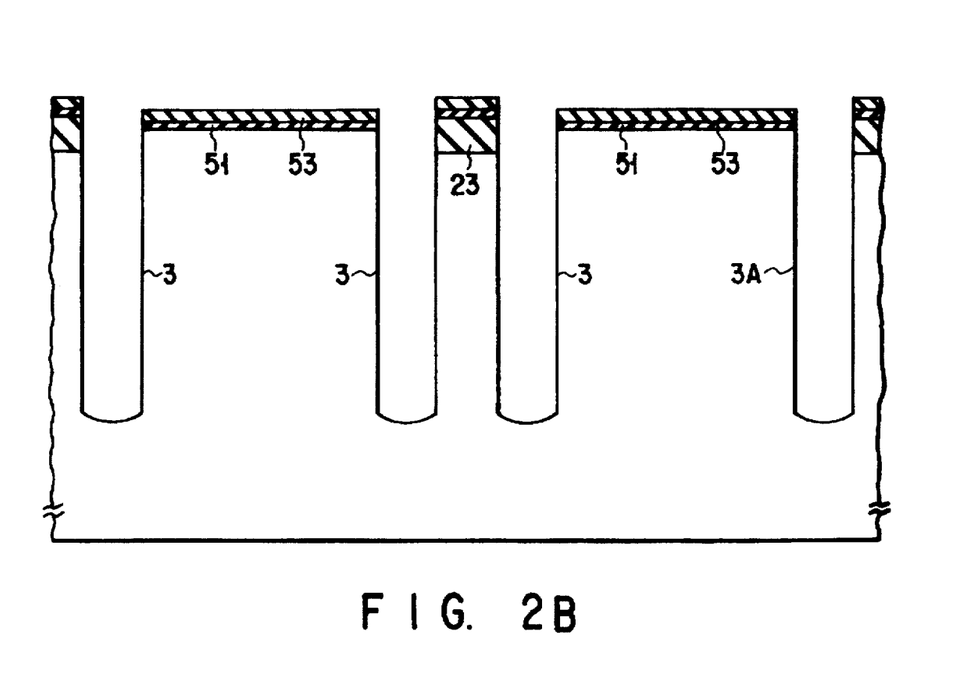
Figure 2C:
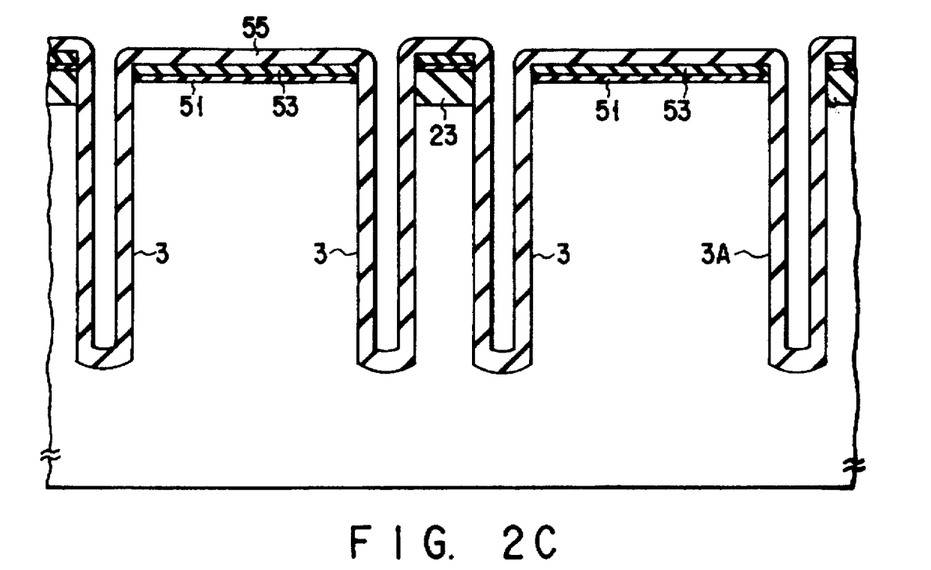
Figure 2D:
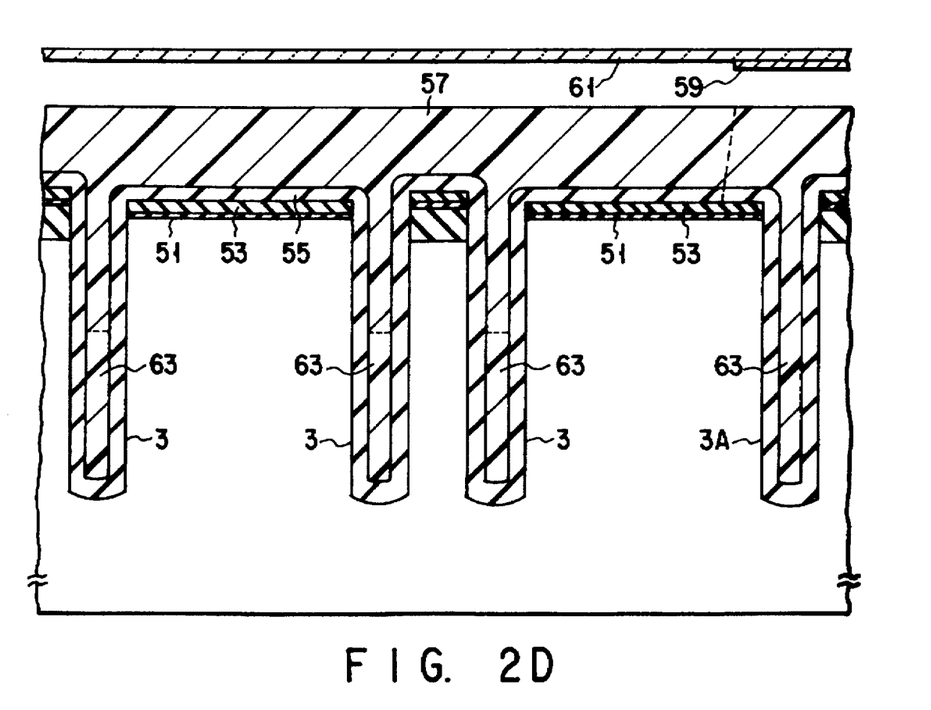
Figure 2E:
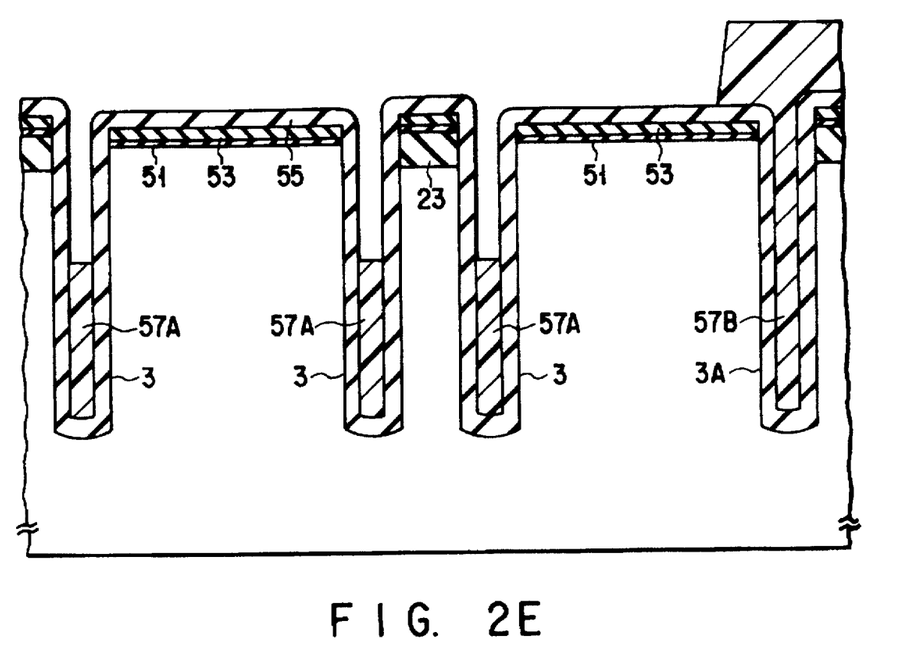
Figure 2F:
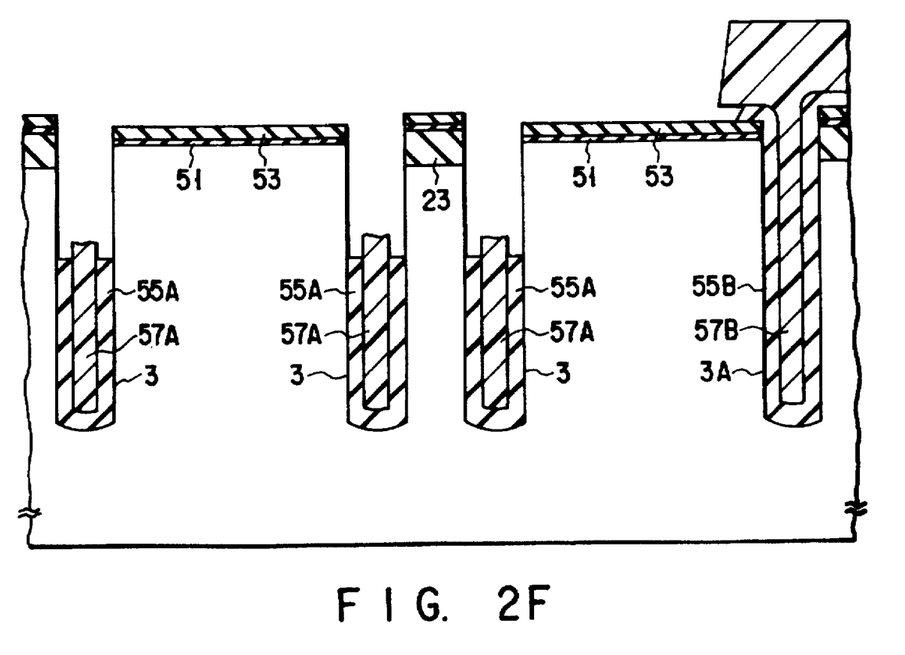
Figure 2G:
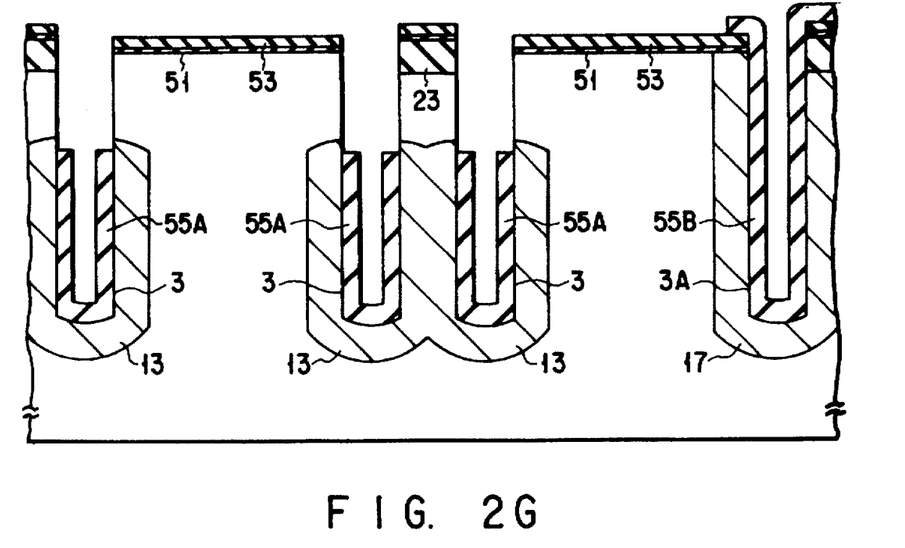
Figure 2H:
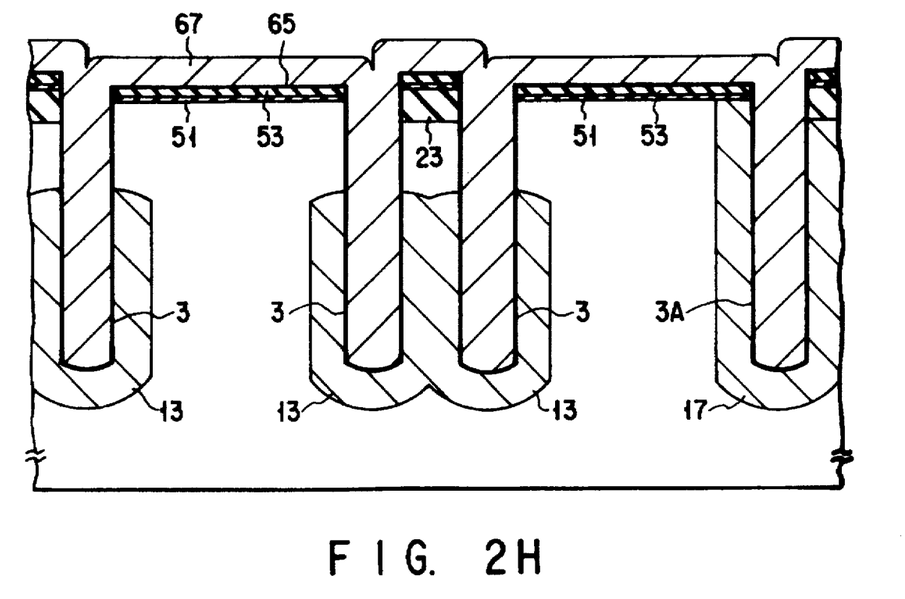
Figure 2I:
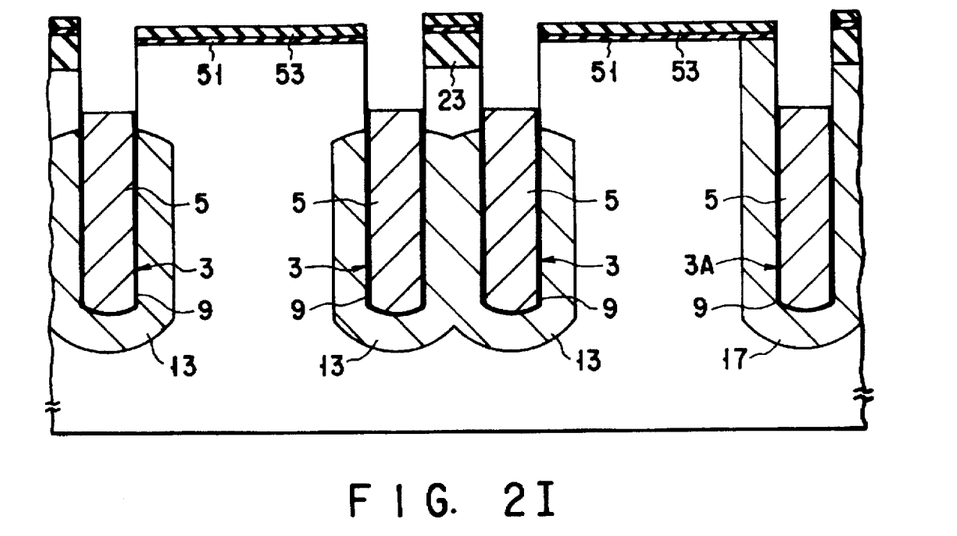
Figure 2J:
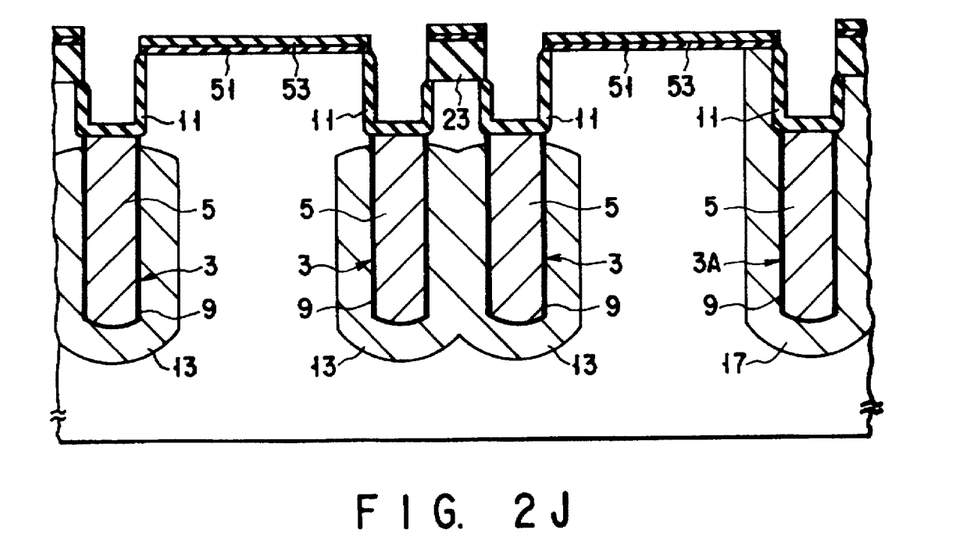
Figure 2K:
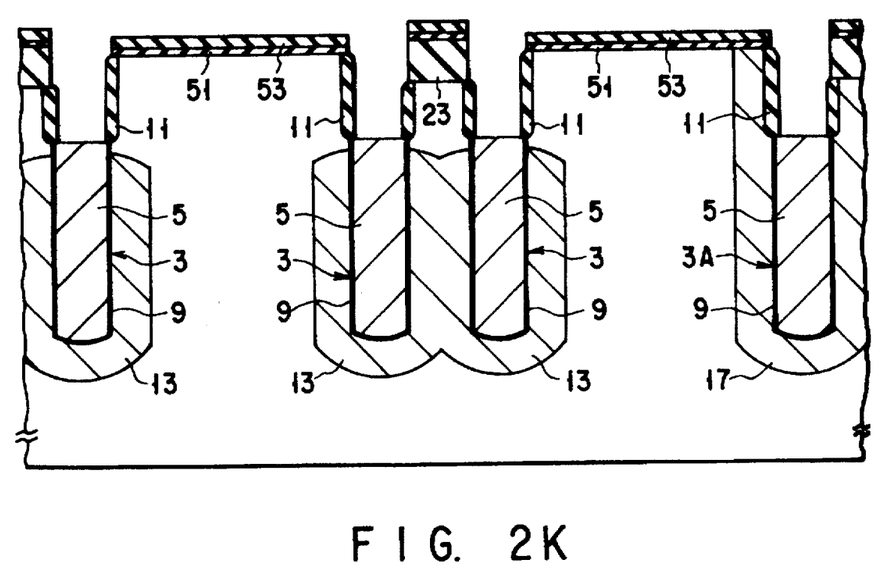
Figure 2L:
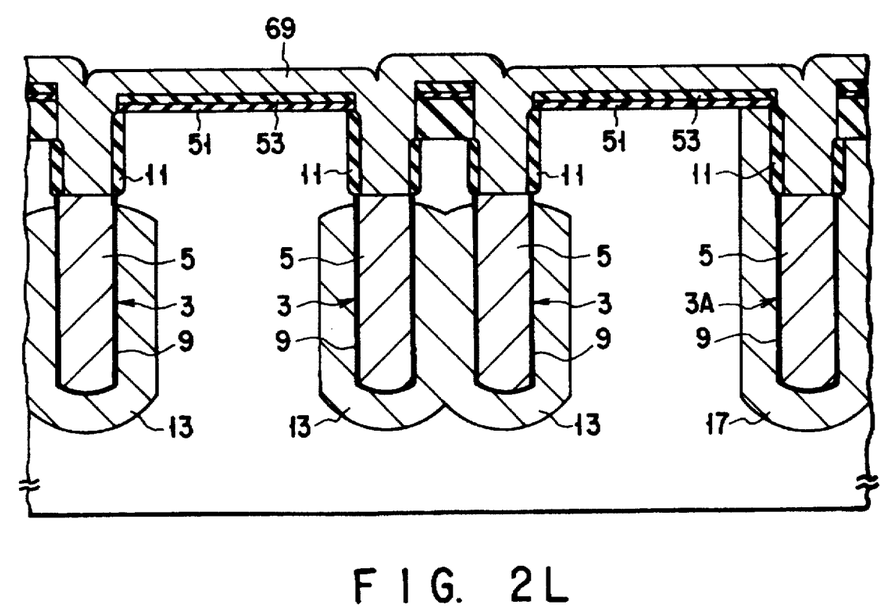
Figure 2M:
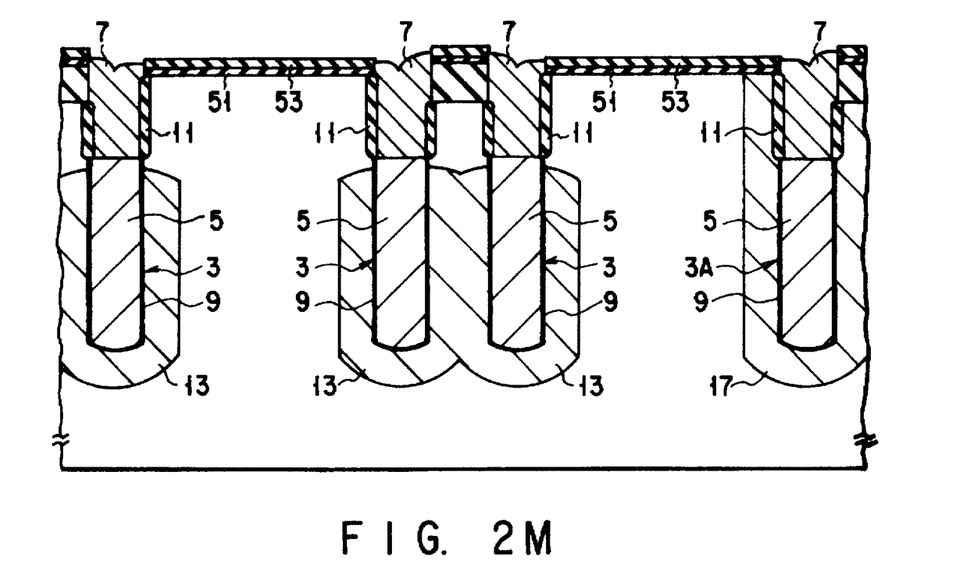
Figure 2N:
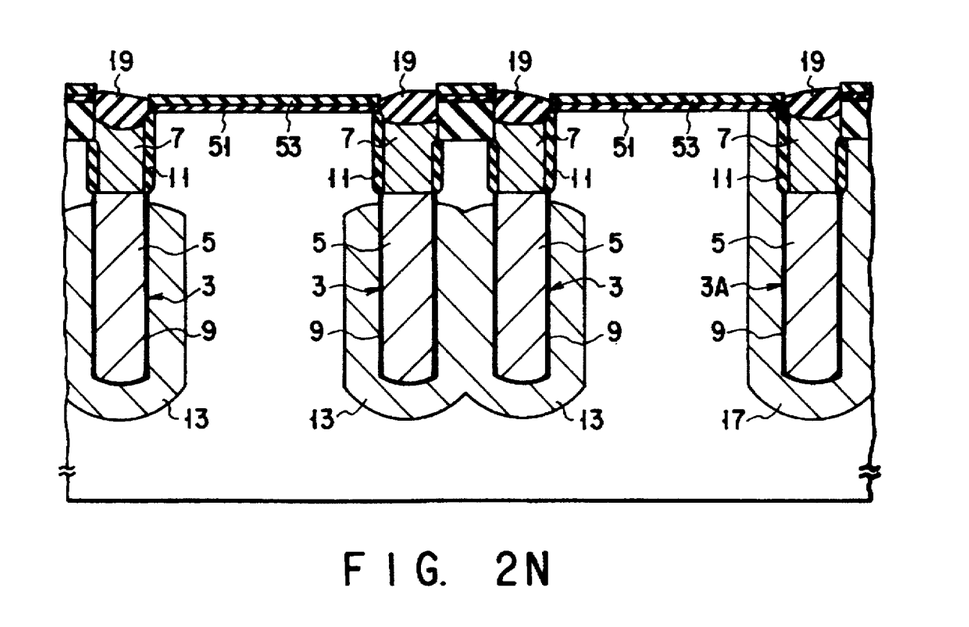
Figure 2O:
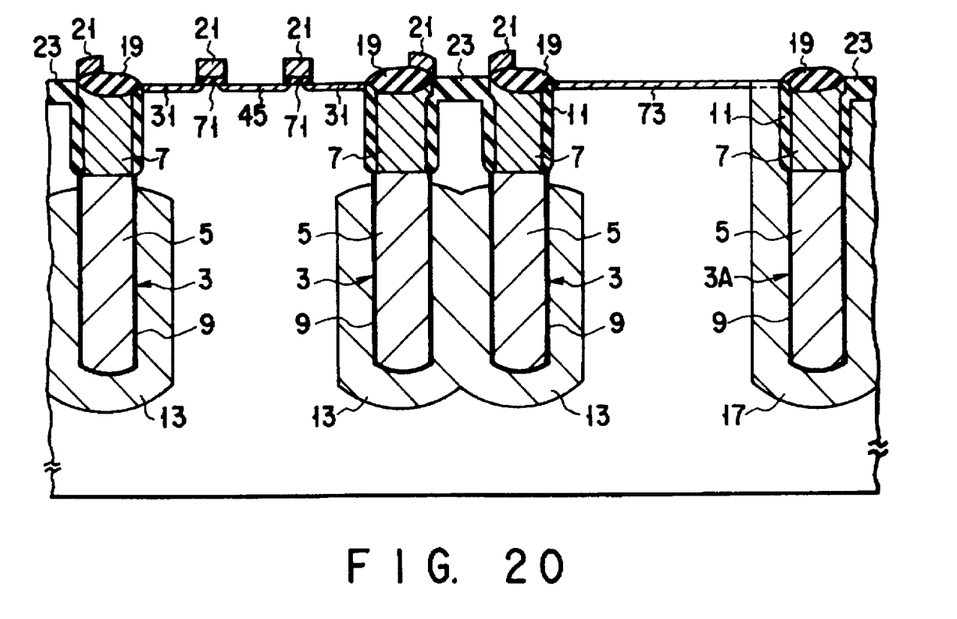
Figure 2P:
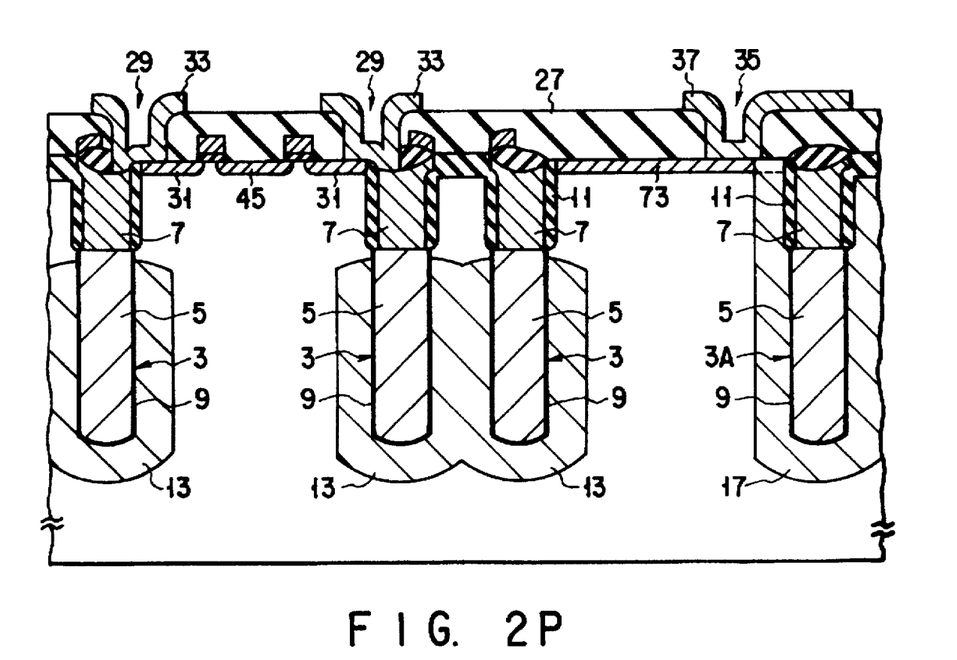

FIGS. 2A through 2P are cross-sectional views of the principal steps of forming a memory cell array as shown in FIGS. 1A and 1B.

First, as shown in FIG. 2A, a P-type silicon substrate 1 is prepared, and a field oxide film 23 is formed on the major part of the surface of the substrate 1 by LOCOS to define rectangular element forming regions 25 on the surface of the substrate 1.

Then, as illustrated in FIG. 2B, the surface of the substrate 1 is thermally oxidized to form a thin oxide film ($SiO_2$) 51 on the surface of silicon exposed from the element forming regions 25. Silicon nitride ($Si_3N_4$) is deposited by CVD on the major part of the substrate 1 to form a slightly thicker nitride film 53. Photoresist is applied onto the nitride film 53 to obtain a resist layer (not shown). After that, a window corresponding to a trench forming pattern is formed in the resist layer by photoetching. Using the resist layer as a mask, the nitride film 53 is etched, and a hole corresponding to the trench forming pattern is formed in the nitride film 53. The oxide films 23 and 51 and substrate 1 are etched by RIE (Reactive Ion Etching) using an etchant. The etchant has a higher etching rate to silicon and silicon dioxide and a lower etching rate to silicon nitride, thereby forming trenches 3 and 3A in the substrate 1.

Referring to FIG. 2C, silicon dioxide containing arsenic is deposited on the major surface of the substrate 1 by LPCVD (Low Pressure Chemical Vapor Deposition) thereby to form an arsenic glass film 55.

As shown in FIG. 2D, positive photoresist is applied to the major surface of the substrate 1 to form a photoresist layer 57. The photoresist is exposed using a glass mask 61 with a light-shielding pattern 59 located at least above the trench 3A. The exposure of photoresist is performed to the depth corresponding to the halfway portions of the trenches 3. In FIG. 2D, reference numeral 63 indicates unexposed portions of the trenches.

As shown in FIG. 2E, the photoresist is developed and thus the unexposed portions 63 remain in the resist layer 57. The layer 57 is divided into a pattern 57A buried to the halfway portions of the trenches 3 and a pattern 57B buried into all the trench 3A and formed thereabove.

In FIG. 2F, the arsenic glass film 55 is etched by CDE (Chemical Dry Etching) which is one of isotropic etching methods and thus processed to have a solid phase diffusion source pattern 55A formed to the halfway portions of the trenches 3 and a solid phase diffusion source pattern 55B buried into all the trench 3A.

Referring to FIG. 2G, by heat treatment after resist patterns 57A and 57B are removed, the arsenic is diffused from the solid phase diffusion source patterns 55A and 55B into the substrate 1 to form N-type diffusion layers 13 and 17. Though not shown in FIG. 2G to avoid complication, the arsenic is diffused until the N-type diffusion layers 13 and 17 contact each other as in the plane pattern shown in FIG. 1A. Thus, the layers 13 and 17 each have a concentration of about $10^{19} cm^{-3}$.

As illustrated in FIG. 2H, after the patterns 55A and 55B are removed using $NH_4F$, silicon nitride and silicon dioxide are deposited on the major surface of the substrate 1 by LPCVD thereby to form an insulation film 65 which will serve as a dielectric of the capacitor. The insulation film 65 is a complex film of silicon nitride ($SiN_X$) and silicon dioxide ($SiO_2$) and serves as a dielectric film having the same capability as that of a silicon dioxide film whose thickness is about 6 nm. After that, conductive silicon is deposited by LPCVD to form a conductive polysilicon layer 67. This layer 67 contains phosphorus.

As shown in FIG. 2I, the polysilicon layer 67 is etched back to the halfway portions of the trenches 3 and 3A by RIE, with the result that a storage node electrode 5 is formed in each of the trenches 3 and 3A. Actually, the electrode 5 of the trench 3A does not function as a storage node electrode but a filler buried into the trench 3A. By removing the exposed insulation film 65, the surface of the substrate 1 is exposed to the side walls of the trenches 3 and 3A and at this time the insulation film 65 remains on the side walls of trenches 3 and 3A and around the storage node electrode 5. The remaining insulation film 65 functions as a dielectric film 9 of the capacitor.

In FIG. 2J, that surface of the substrate 1 which is exposed to the side walls of the trenches 3 and 3A is thermally oxidized thereby to form oxide films ($SiO_2$) 11.

As shown in FIG. 2K, the oxide films 11 are etched back by RIE to expose the surfaces of the storage node electrodes 5.

Referring to FIG. 2L, conductive silicon is deposited on the major surface of the substrate 1 by LPCVD thereby to form a conductive polysilicon layer 69. This layer 69 includes phosphorus.

In FIG. 2M, the conductive polysilicon layer 69 is etched back; thus a hollow in the trenches 3 and 3A is filled with the conductive polysilicon layer 7.

As illustrated in FIG. 2N, the substrate 1 is thermally oxidized using the nitride film 53 as an oxidation barrier and an oxide film ($SiO_2$) 19 of about 100 nm is formed on the surface of the conductive polysilicon layer 7.

As shown in FIG. 2O, after the nitride film 53 and oxide film 51 are eliminated, the substrate 1 is thermally oxidized to form silicon dioxide films 71, which serve as a gate insulation film, on the silicon surfaces exposed from the element forming regions. Then conductive silicon is deposited on the major surface of the substrate 1 to form a conductive polysilicon layer, and the conductive polysilicon layer is patterned to form a word-line 21. Using the field oxide film 23, oxide film 19 and word-line 21 as masks, arsenic ions are implanted into the substrate 1, thus forming an N-type source diffusion layer 31 and an N-type drain diffusion layer 45 in the substrate 1. In this embodiment, an element forming region is provided in the vicinity of the trench 3A, and an N-type diffusion layer 73 is formed in that area of the substrate 1 which corresponds to the element forming region. The layer 73 is electrically connected to the N-type diffusion layer 17.

As illustrated in FIG. 2P, silicon dioxide is deposited on the surface of the silicon 1 by LPCVD to form an oxide film 27. Contact holes 29 and 35 are formed in the oxide film 27 by photoetching. Conductive silicon is deposited on the oxide film 27 by LPCVD to form a conductive polysilicon layer. The conductive polysilicon layer is patterned to form a wiring layer 33 for connecting one source diffusion layer 31 and one storage node electrode 5 via the polysilicon layer 7 to each other, and a plate potential applying line 37.

As shown in FIG. 1B, silicon dioxide is deposited on the oxide film 27 by LPCVD to form an oxide film 39. Contact holes 41 are formed in the oxide film 39 by photoetching. A two-layered (polycide) film of polysilicon and silicide is formed on the oxide film 39. The two-layered film is patterned to form a bit-line 43.

The DRAM according to the first embodiment can be manufactured through the above-described process.

Figure 3:
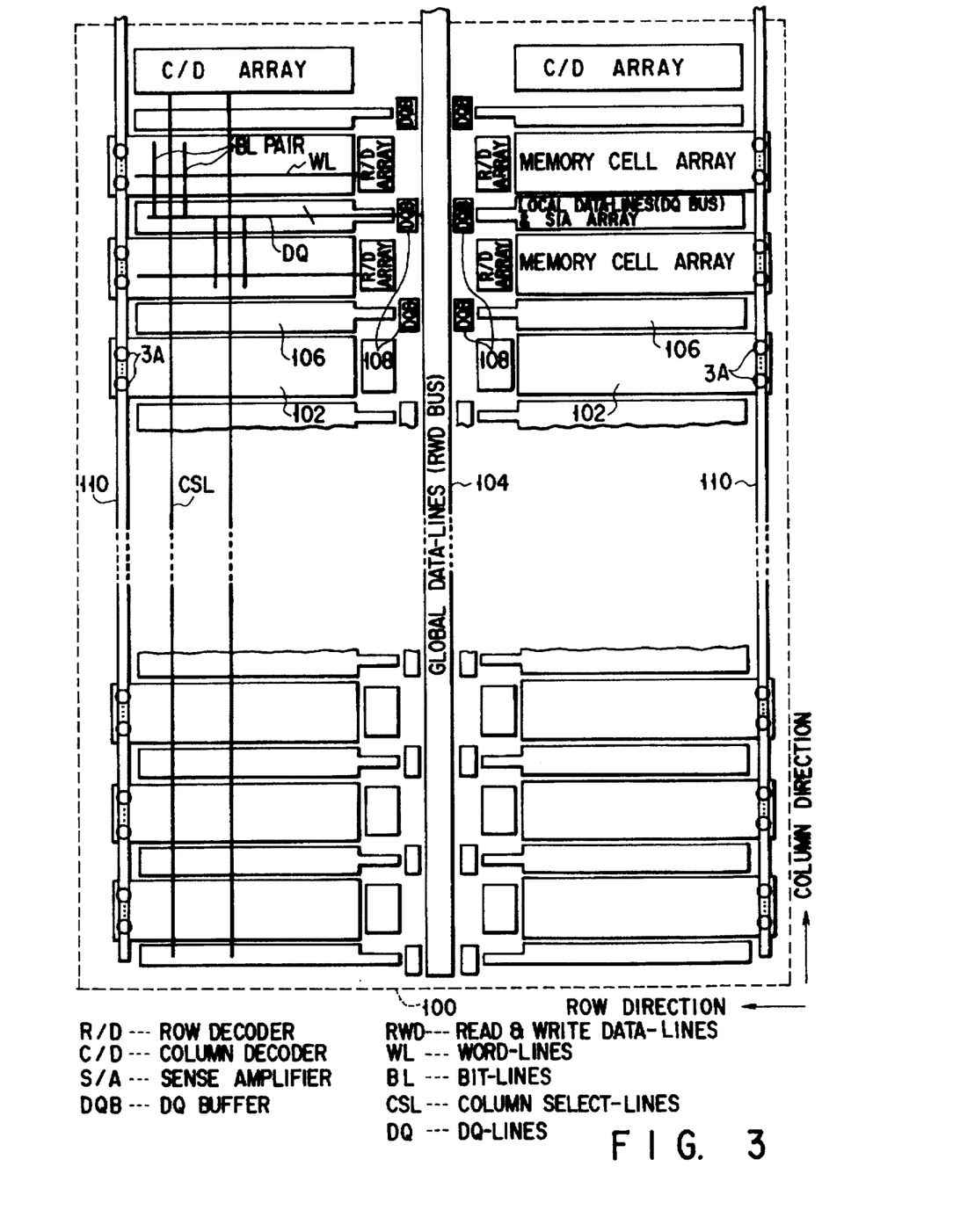
FIG. 3 is a block diagram of a 16 Mb memory core of a 64 Mb DRAM.

FIG. 3 is a block diagram of a 16 Mb memory core of a 64 Mb DRAM.

Referring to FIG. 3, the 16 Mb memory core 100 includes sixty-four 256 Kb memory cell arrays 102. Global data-lines (RWD-lines) 104 are formed on the center line of the memory core 100 in its column direction. A plurality of pairs of local data lines (DQ-lines) included in a DQ bus & sense amplifier array 106 are connected to a plurality of RWD lines included in the RWD bus 104 through DQ buffers 108. The DQ and RWD-lines are I/O data lines.

The memory cell arrays 102 are arranged 32 by 32 in the memory core 100 symmetrically with regard to the RWD bus 104. Plate potential supply-lines 110 extend in parallel to the RWD bus 104 and along the edge of the memory core 100. One of the supply-lines 110 applies a plate potential to 32 memory cell arrays 102, while the other supply-line 110 does the same to the other 32 memory cell arrays 102. A plate is provided for each of the memory cell arrays.

In FIG. 3, R/D indicates a row decoder; C/D, a column decoder; S/A, a sense amplifier; DQB, a DQ buffer; BL, bit-lines; WL, word-lines; CSL, column select-lines; and DQ, DQ-lines.

If four 16 Mb memory cores, as described above, are provided on a single chip, a 64 Mb DRAM can be obtained.

Figures 4, 5:
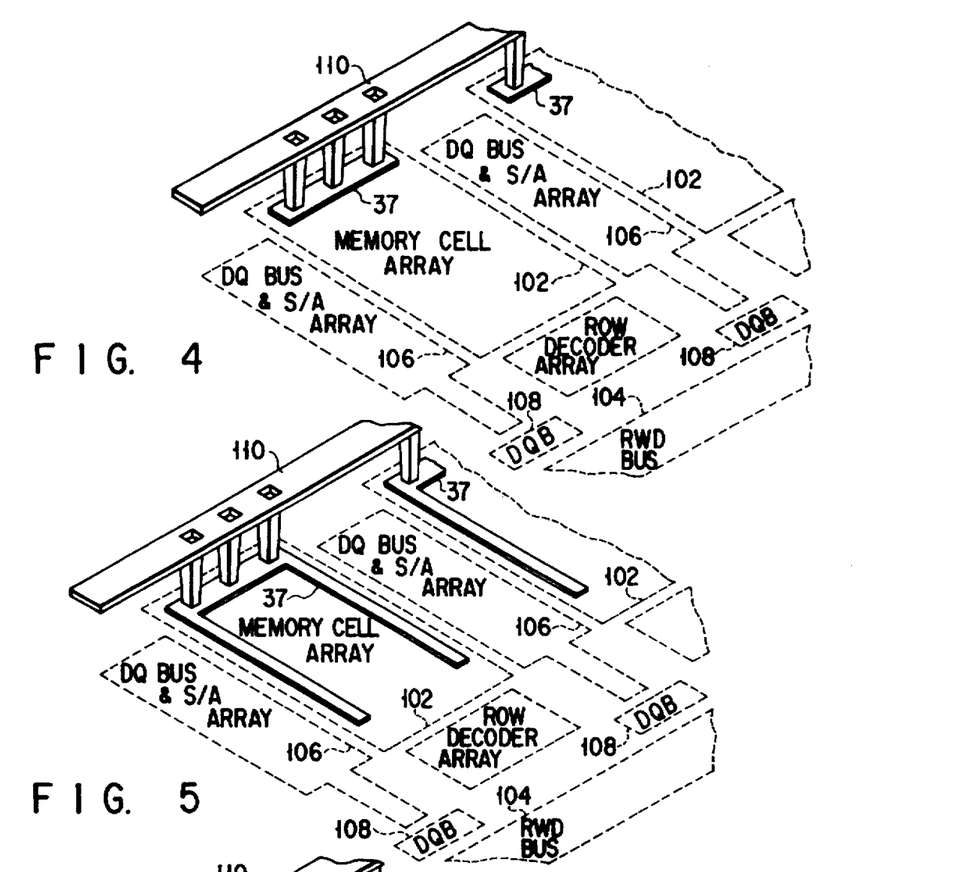
FIG. 4 is an enlarged perspective view of a nearby portion of a memory cell array shown in FIG. 3.
FIG. 5 is an enlarged perspective view of a nearby portion of a memory cell array of a DRAM according to a second embodiment of the present invention.

FIG. 4 is an enlarged perspective view of a nearby portion of one memory cell array shown in FIG. 3.

As shown in FIG. 4, the plate potential feeding-line 37, which is connected to the N-type diffusion layer 17 formed along the side wall of the trench 3A, is formed so as to face the row decoder. The plate potential VPL is applied from the plate potential supply-line 110 to the buried-wiring layer 15, as shown in FIG. 1B, through the feeding-line 37 and the layer 17, as shown in FIG. 1B.

Strictly speaking, in the configuration shown in FIG. 4, the trench 3A is not formed directly under the bit-lines shown in FIGS. 1A and 1B but in the vicinity of the distal end of the word-line 21 extending opposite to the row decoder. However, the trench and N-type diffusion layer, shown in FIG. 4, are the same as trench 3A and N-type diffusion layer 17, shown in FIGS. 1A and 1B, in configuration and manufacturing method.

A DRAM according to each of the second and third embodiments will now be described. The second and third embodiments differ from the first embodiment in the location of plate potential feeding-line 37 formed on a DRAM chip.

Figure 6:
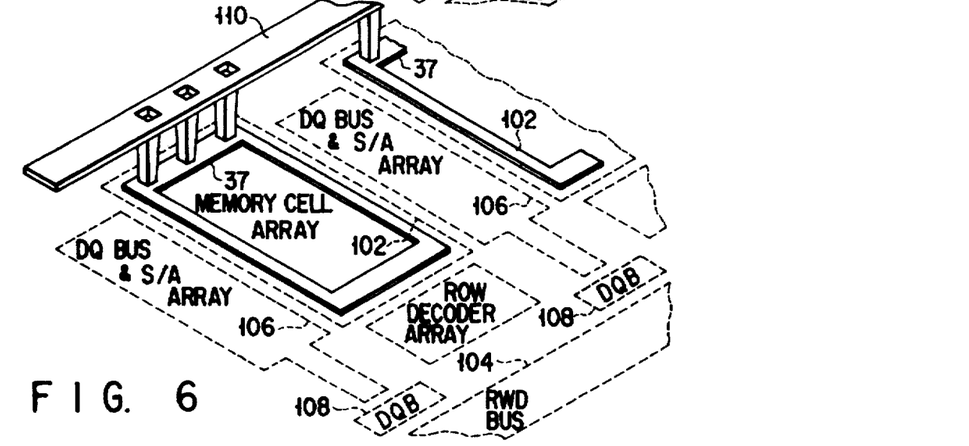
FIG. 6 is an enlarged perspective view of a nearby portion of a memory cell array of a DRAM according to a third embodiment of the present invention.

FIG. 5 is an enlarged view of a nearby portion of a memory cell array of the DRAM according to the second embodiment, and FIG. 6 is also an enlarged view of a nearby portion of a memory cell array of the DRAM according to the third embodiment.

Referring to FIG. 5, a plate potential feeding-line 37 is formed along its opposing face of a row decoder and along a DQ bus & sense amplifier array 106. Thus, a plate potential VPL is applied to a buried-wiring layer 15 from three sides of the memory cell array, and the potential of the buried-wiring layer 15 becomes more stable than in the pattern of the plate potential feeding-line 37 shown in FIG. 4.

Referring to FIG. 6, a plate potential feeding-line 37 is formed along the edge of a memory cell array 102. Therefore, a plate potential VPL is applied to a buried-wiring layer 15 from four sides of the memory cell array, and the potential of the buried-wiring layer 15 can be stabilized further.

A DRAM according to a fourth embodiment of the present invention will now be described. In the fourth embodiment, the location of a transistor for constituting a sense amplifier on a DRAM chip is improved.

A sense amplifier is provided for each column and adjacent to a 256 Kb cell array 102. The sense amplifier is a CMOS sense amplifier (cross-couple CMOS latch circuit). An N-channel MOSFET of the CMOS sense amplifier is formed in a P-type well where a memory cell transistor is to be formed.

Figure 7A:
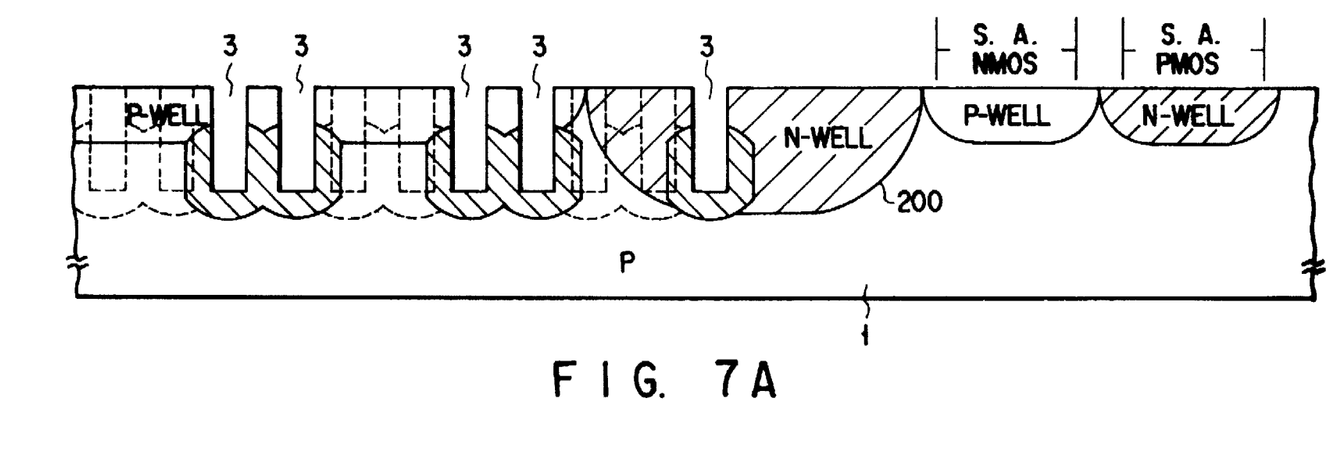
FIG. 7A is a cross-sectional view of a prior art DRAM.
Figure 7B:
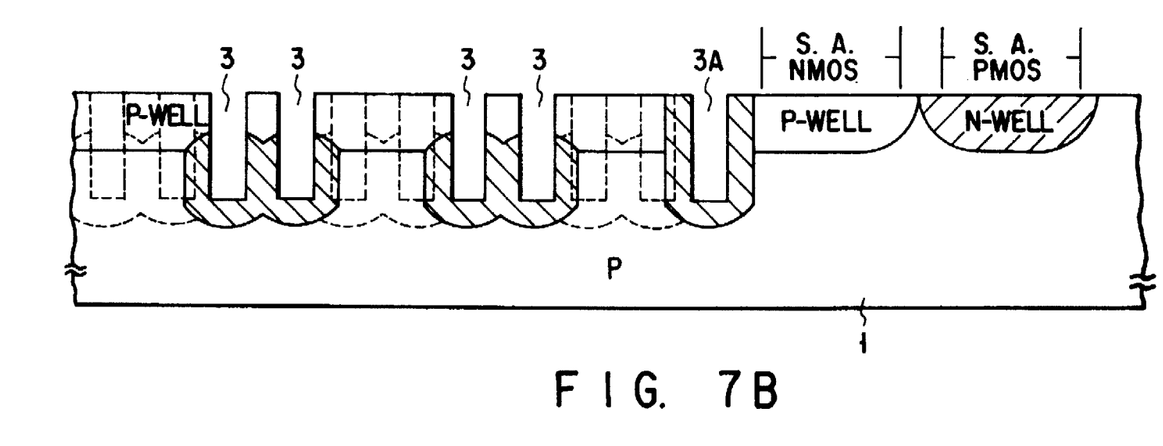
FIG. 7B is a cross-sectional view of a DRAM according to a fourth embodiment of the present invention.

FIG. 7A is a cross-sectional view of a prior art DRAM, and FIG. 7B is a cross-sectional view of the DRAM according to the fourth embodiment of the present invention.

In the prior art DRAM shown in FIG. 7A, a deep well 200 has to be formed between a P-type well for forming a memory cell transistor and a P-type well for forming a sense amplifying NMOS.

The DRAM of the present invention does not necessitate the deep well 200 and, as shown in FIG. 7B, is capable of using a P-type well both for forming a memory cell transistor and for forming a sense amplifying NMOS.

In the DRAM of the first embodiment, since the N-type diffusion layer 17 is formed along the side wall of the trench 3A, a potential can be applied to the buried-wiring layer in a smaller area than in the DRAM having a well for leading a buried wiring layer.

Furthermore, it is only the storage node electrode 5 that is formed in the trench 3A; therefore, the diameter of the trench 3A can be made smaller than in the DRAM where both a plate electrode and a storage node electrode are formed in a trench.

According to the method of manufacturing the DRAM of the first embodiment, since the step of manufacturing the trench 3A and that of doing the trench 3 can be made common to each other, the manufacturing method can be simplified. In particular, when a solid phase diffusion source pattern is formed in each of the trenches 3 and 3A, it can be formed not only to the halfway portion of the trench 3 but also to all the trench 3A by a single photoetching method, as shown in FIGS. 2D, 2E, 2F.

As described above, since the DRAM of the first embodiment has the structure which is easy to achieve, the yield in manufacture can easily be improved. The DRAM having trench 3A can be manufactured even though the memory capacity and the number of integrated devices are very large.

In the DRAM of the second embodiment, since the plate potential feeding-line 37 is formed along its opposing face of the row decoder and along the DQ bus & sense amplifier array, the plate potential VPL can be applied from three sides of the memory cell array. In addition to the advantage of the first embodiment, the potential of the buried-wiring layer 15 can be stabled.

In the DRAM of the third embodiment, since the plate potential feeding-line 37 is formed along the edge of the memory cell array, the plate potential VPL is applied from four sides of the memory cell array and thus the potential of the buried-wiring layer 15 is stabilized further.

In the DRAM of the fourth embodiment, the trench 3A is interposed between the memory cell array and sense amplifier, and one P-type well is used for forming both a memory cell transistor and a sense amplifying NMOS. Consequently, in addition to the advantages of the second and third embodiments, the stability of plate potential VPL and the improvement in integration can be achieved simultaneously.

As described above, according to the present invention, there can be provided a semiconductor device having a connecting device capable of applying a potential to the buried-wiring layer in a small area, and a method of manufacturing the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:

first and second trenches formed in a semiconductor substrate of a first conductivity type;

a first diffusion layer of a second conductivity type, buried in said semiconductor substrate and formed around said first trench;

a second diffusion layer of the second conductivity type, formed around said second trench, contacting said first diffusion layer, and reaching a surface of said semiconductor substrate;

a first conductor with which said first and second trenches are partially filled:

a dielectric film formed between said first conductor in said first and second trenches and said first and second diffusion layers;

a second conductor which contacts said first conductor in said first and second trenches and with which said first and second trenches are filled;

an insulator formed between said second conductor in said first trench and said semiconductor substrate and between said second conductor in said second trench and said second diffusion layer, said insulator being thicker than said dielectric film;

a memory cell transistor formed on said semiconductor substrate, said memory cell transistor having a source and a drain, one of which is connected to said second conductor in said first trench; and a plate potential supply-line connected to said second diffusion layer, wherein said memory cell transistor is in a memory cell array comprising a plurality of memory cell transistors arranged in a matrix, and wherein said memory cell array includes:

a first side which is adjacent to a row decoder array having a plurality of row decoders for activating word-lines;

a second side which is adjacent to a first sense amplifier array having a plurality of sense amplifiers for amplifying potentials of first bit-lines;

a third side which is adjacent to a second sense amplifier array having a plurality of sense amplifiers for amplifying potentials of second bit-lines; and a fourth side which is opposite to said first side, and said second diffusion layer is formed along said second, third and fourth sides of said memory cell array.

2. A semiconductor memory device, comprising:

memory cells formed on a semiconductor substrate of a first conductivity type and each coupled to a buffed-wiring layer of a second conductivity type, a first trench formed so as to reach said buried-wiring layer, and a storage node electrode filling in said first trench, said buried-wiring layer serving as a plate electrode;

a second trench formed so as to reach said buried wiring layer and filled with a trench fill having a structure which is the same as the structure of said storage node electrode filling in said first trench; and a vertical-wiring layer of the second conductivity type, which is formed along a side wall of said second trench and substantially vertically to a surface of said semiconductor substrate, for leading said buried wiring layer to the surface of said semiconductor substrate, wherein said memory cells are in a memory cell array comprising a plurality of memory cells arranged in a matrix, and wherein said memory cell array includes:

a first side which is adjacent to a row decoder array having a plurality of row decoders for activating word-lines;

a second side which is adjacent to a first sense amplifier array having a plurality of sense amplifiers for amplifying potentials of first bit-lines;

a third side which is adjacent to a second sense amplifier array having a plurality of sense amplifiers for amplifying potentials of second bit-lines; and a fourth side which is opposite to said first side, and said vertical wiring layer is formed along said second, third and fourth sides of said memory cell array.

3. A semiconductor memory device, comprising:

memory cells formed on a semiconductor substrate of a first conductivity type, each memory cell including a first trench formed in said semiconductor substrate, a storage node electrode filling said first trench, and a plate electrode of a second conductivity type formed outside said first trench; and a vertical wiring layer of the second conductivity type which is formed outside a second trench formed in said semiconductor substrate and filled with a trench fill having the same structure as said storage node electrode filling said first trench, said vertical-wiring layer leading said plate electrode to a surface of said semiconductor substrate, wherein said memory cells are in a memory cell array comprising a plurality of memory cells arranged in a matrix, and wherein said memory cell array includes:

a first side which is adjacent to a row decoder army having a plurality of row decoders for activating word lines;

a second side which is adjacent to a first sense amplifier array having a plurality of sense amplifiers for amplifying potentials of first bit-lines;

a third side which is adjacent to a second sense amplifier array having a plurality of sense amplifiers for amplifying potentials of second bit-lines; and a fourth side which is opposite to said first side, and said vertical-wiring layer is formed along said second, third and fourth sides of said memory cell array.

4. A semiconductor device comprising:

a semiconductor region of a second conductivity type buried into a semiconductor substrate of a first conductivity type;

a first trench formed in the semiconductor substrate so as to reach said semiconductor region and filled with an electrode whose capacitance is coupled to said semiconductor region; and a second trench filled with a trench fill having the same structure as the electrode filling said first trench, a wiring layer of the second conductivity type for pulling up said semiconductor region to a surface of said semiconductor substrate being formed around said second trench, wherein said memory cell array includes:

a first side which is adjacent to a row decoder array having a plurality of row decoders for activating word lines;

a second side which is adjacent to a first sense amplifier array having a plurality of sense amplifiers for amplifying potentials of first bit-lines;

a third side which is adjacent to a second sense amplifier array having a plurality of sense amplifiers for amplifying potentials of second bit-lines; and a fourth side which is opposite to said first side, and said wiring layer is formed along said second, third and fourth sides of said memory cell array.

5. A semiconductor memory device, comprising:

a semiconductor substrate of a first conductivity type;

a plurality of memory cell arrays provided on said semiconductor substrate;

a plate electrode of a second conductivity type formed in said semiconductor substrate for each of said plurality of memory cell arrays;

a plate potential feeding-line formed above said plate electrode;

a first group of trenches formed in said semiconductor substrate near said plate potential feeding-line so as to reach said plate electrode, said first group of trenches being arranged along said plate potential feeding-line;

a second group of trenches formed in said semiconductor substrate so as to reach said plate electrode, said second group of trenches being adjacent to said first group of trenches;

storage node electrodes with which the trenches of said second group of trenches are filled, each storage node electrode having a capacitance coupled to said plate electrode;

trench fills with which the trenches of said first group of trenches are filled, the structure of said trench fills being the same as the structure of the storage node electrodes with which said second group of trenches are filled; and a wiring layer of the second conductivity type formed along side walls of said first group of trenches, and contacting said plate electrode and said plate potential feeding-line, wherein said plate potential feeding-line is formed along a first side of each of said plurality of memory cell arrays which is opposite to a row decoder for activating word-lines, along a second side of each of said plurality of memory cell arrays which is adjacent to a first sense amplifier array, and along a third side of each of said plurality of memory cell arrays which is adjacent to a second sense amplifier array.

6. A semiconductor memory device according to claim 5, wherein said device further comprises a potential supply-line for supplying a potential to said plate potential feeding-line, and said plate potential feeding-line is constituted by a conductive layer other than said potential supply-line.

7. A semiconductor memory device, comprising:

a semiconductor substrate of a first conductivity type;

a plurality of memory cell arrays provided on said semiconductor substrate;

a plate electrode of a second conductivity type formed in said semiconductor substrate for each of said plurality of memory cell arrays;

a plate potential feeding-line formed above said plate electrode;

a first group of trenches formed in said semiconductor substrate near said plate potential feeding-line so as to reach said plate electrode, said first group of trenches being arranged along said plate potential feeding-line;

a second group of trenches formed in said semiconductor substrate so as to reach said plate electrode, said second group of trenches being adjacent to said first group of trenches;

storage node electrodes with which the trenches of said second group of trenches are filled, each storage node electrode having a capacitance coupled to said plate electrode;

trench fills with which the trenches of said first group of trenches are filled, the structure of said trench fills being the same as the structure of the storage node electrodes with which said second group of trenches are filled; and a wiring layer of the second conductivity type formed along side walls of said first group of trenches, and contacting said plate electrode and said plate potential feeding-line, wherein said plate potential feeding-line is formed along all the sides of each of said plurality of memory cell arrays.

8. A semiconductor memory device according to claim 7, wherein said device further comprises a potential supply-line for supplying a potential to said plate potential feeding-line, and said plate potential feeding-line is constituted by a conductive layer other than said potential supply-line.

9. A semiconductor memory device, comprising:

a semiconductor substrate;

a first impurity layer buried in said semiconductor substrate;

memory cells arranged in a memory cell array on said semiconductor substrate, wherein said impurity layer comprises an electrode of said memory cells;

a second impurity layer formed in said semiconductor substrate and leading out said first impurity layer to a surface of said semiconductor substrate;

a row decoder circuit formed adjacent to a first side of said memory cell array;

a first sense amplifier circuit formed adjacent to a second side of said memory cell array; and a second sense amplifier circuit formed adjacent to a third side of said memory cell array, wherein said second impurity layer is formed along said second side of said memory cell array, along said third side of said memory cell army, and along a fourth side of said memory cell array opposite to said first side.

10. A semiconductor memory device according to claim 9, wherein said second impurity layer is further formed along said first side of said memory cell array.

11. A semiconductor memory device, comprising:

a semiconductor substrate;

a first impurity layer buried in said semiconductor substrate;

memory cells arranged in a memory cell array on said semiconductor substrate, wherein said impurity layer comprises an electrode of said memory cells;

a second impurity layer formed in said semiconductor substrate and leading out said first impurity layer to a surface of said semiconductor substrate;

a row decoder circuit formed adjacent to a first side of said memory cell array;

a first sense amplifier circuit formed adjacent to a second side of said memory cell array; and a second sense amplifier circuit formed adjacent to a third side of said memory cell array, wherein said second impurity layer is formed along more than one of said first side of said memory cell array, said second side of said memory cell array, said third side of said memory cell array, and a fourth side of said memory cell array opposite to said first side.

* * * * *